United States Patent
Le Tual et al.

(10) Patent No.: US 8,497,795 B2
(45) Date of Patent: Jul. 30, 2013

(54) DIFFERENTIAL SUCCESSIVE APPROXIMATION ANALOG TO DIGITAL CONVERTER

(75) Inventors: Stéphane Le Tual, Saint Egreve (FR); Pratap Narayan Singh, Varanasi (IN); Oleksiy Zabroda, Orleans (CA); Nicola Vannucci, Pisa (IT)

(73) Assignees: STMicroelectronics S.A., Montrouge (FR); STMicroelectronics Pvt. Ltd., Greater Noida (IN); STMicroelectronics (Canada) Inc., Nepean (CA); STMicroelectronics S.r.l., Agrate Brianza (MI) (IT)

( * ) Notice: Subject to any disclaimer, the term of this patent is extended or adjusted under 35 U.S.C. 154(b) by 0 days.

(21) Appl. No.: 13/166,117

(22) Filed: Jun. 22, 2011
(Under 37 CFR 1.47)

(65) Prior Publication Data
US 2012/0139771 A1    Jun. 7, 2012

(30) Foreign Application Priority Data

Jun. 24, 2010    (FR) ...................................... 10 55050

(51) Int. Cl.
*H03M 1/34*    (2006.01)
(52) U.S. Cl.
USPC .......................................... 341/163; 341/155
(58) Field of Classification Search
USPC .......................................... 341/155, 163, 172
See application file for complete search history.

(56) References Cited

U.S. PATENT DOCUMENTS

| | | | |
|---|---|---|---|
| 5,581,252 A | 12/1996 | Thomas | |
| 6,538,594 B1 | 3/2003 | Somayajula | |
| 6,864,821 B2 * | 3/2005 | Yang | 341/155 |
| 6,914,550 B2 * | 7/2005 | Cai | 341/155 |
| 7,432,844 B2 * | 10/2008 | Mueck et al. | 341/163 |
| 8,004,449 B2 * | 8/2011 | Yoshioka | 341/172 |
| 2010/0079318 A1 | 4/2010 | Berens et al. | |

OTHER PUBLICATIONS

French Search Report dated Apr. 1, 2011 from corresponding French Application No. 10/55050.

* cited by examiner

*Primary Examiner* — Brian Young
(74) *Attorney, Agent, or Firm* — Wolf, Greenfield & Sacks, P.C.

(57) ABSTRACT

A differential successive approximation analog to digital converter including: a comparator; a first plurality of capacitors coupled between a corresponding plurality of first switches and a first input of the comparator, at least one of the first capacitors being arranged to receive a first component of a differential input signal; and a second plurality of capacitors coupled between a corresponding plurality of second switches and a second input of the comparator, at least one of the second capacitors being arranged to receive a second component of the differential input signal, wherein each of the first and second plurality of switches are each adapted to independently couple the corresponding capacitor to a selected one of: a first supply voltage level; a second supply voltage level; and a third supply voltage level; and control circuitry adapted to sample the differential input voltage during a sample phase, and to control the first and second switches to couple each capacitor of the first and second plurality of capacitors to the third supply voltage level at the start of a voltage conversion phase.

27 Claims, 5 Drawing Sheets

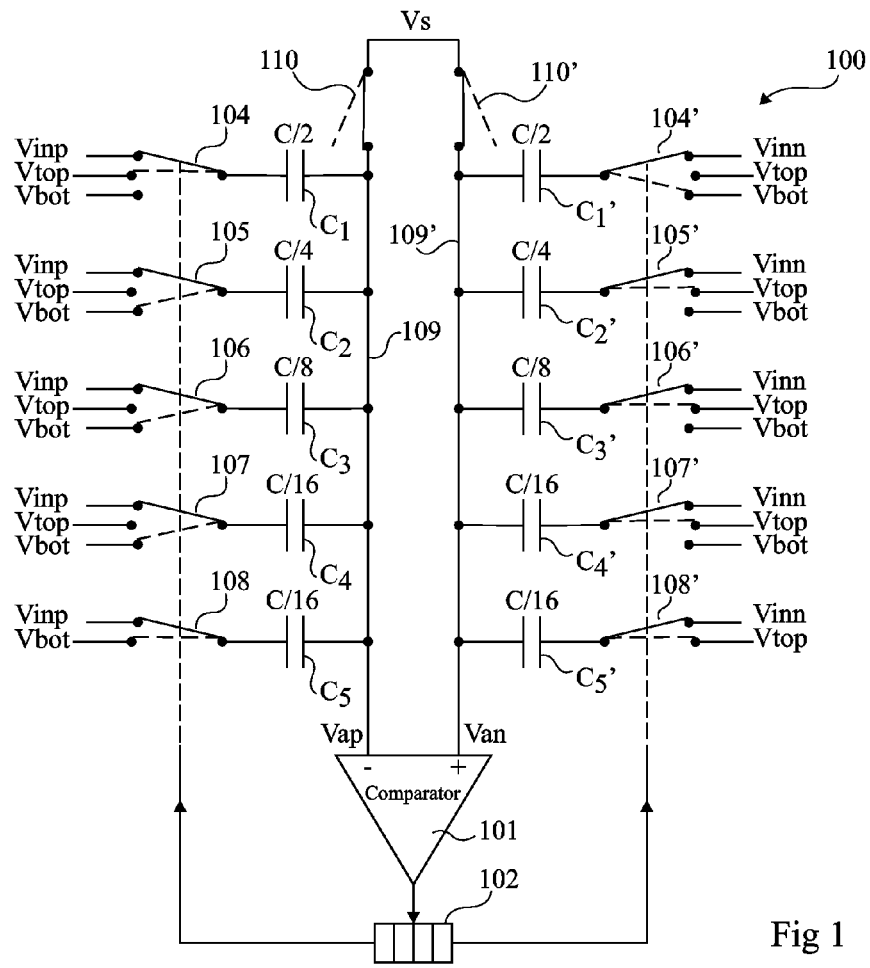
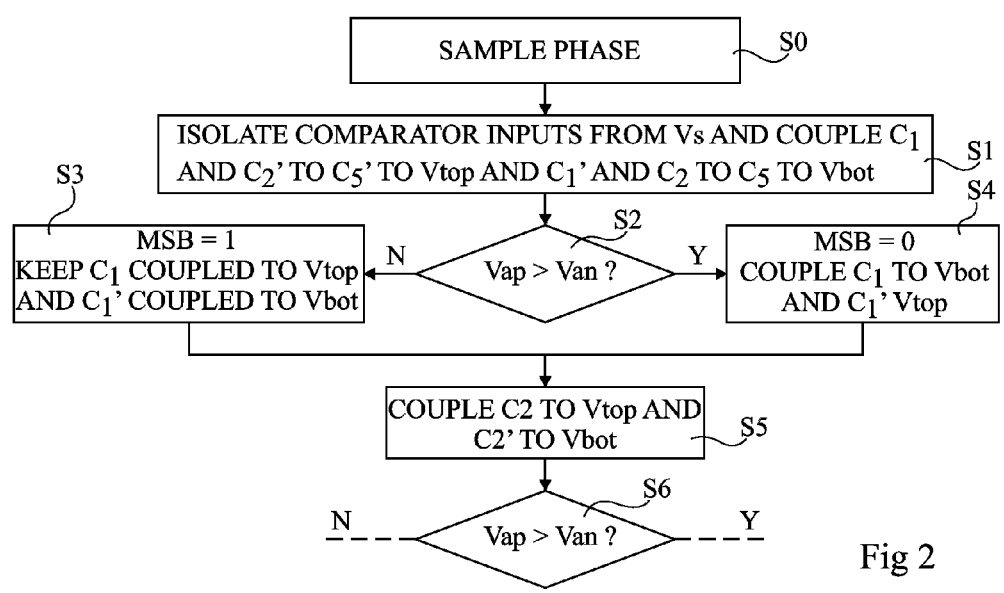
Fig 1
Fig 2

DIFFERENTIAL SUCCESSIVE APPROXIMATION ANALOG TO DIGITAL CONVERTER

CROSS REFERENCE TO RELATED APPLICATIONS

This application claims the priority benefit of French patent application Ser. No. 10/55050, filed on Jun. 24, 2010, entitled "Differential Successive approximation Analog to Digital Converter," which is hereby incorporated by reference to the maximum extent allowable by law.

BACKGROUND OF THE INVENTION

1. Field of the Invention

The present invention relates to a differential successive approximation (SAR) analog to digital converter (ADC). In particular, the present invention relates to a differential SAR ADC and a method of performing successive approximation for analog to digital conversion based on a capacitor array.

2. Discussion of the Related Art

SAR ADC converters generally comprise one or more n-bit converters that operate in parallel. Each n-bit converter is arranged to sample an input voltage, and generates an n-bit digital value corresponding to the amplitude of the input voltage.

Generating the n-bit digital value generally involves sampling each component of the differential input signal by corresponding sets of capacitors each having binary weighted capacitance values corresponding to the most significant to least significant bits of the n-bit output signal. The sets of capacitors are coupled to respective inputs of a comparator, and a trial and error process is then used to determine, for each capacitor in turn, what combination of high and low voltages coupled to each capacitor balances the comparator.

The operating speed of such a converter is determined to some extent by the speed at which the capacitors may be recharged between each bit decision, and this is determined by the amount of charge that needs to be drawn from the supply voltages after each bit decision. If the charge can not be drawn fast enough to recharge the capacitors, the signature of the input signal may remain on the capacitors, leading to a non-linearity in the operation of the converter. Furthermore, the more charge that needs to be drawn, the greater the power consumption of the converter.

One option for reducing the amount of charge that needs to be transferred from the supply voltages would be to reduce the size of each of the capacitors. However, this can increase the noise and reduce linearity leading to errors in the output signal.

Thus there is a need for an improved differential converter that draws a reduced charge from the supply voltages.

SUMMARY OF THE INVENTION

Embodiments aim to at least partially overcome one or more needs in the prior art.

According to one embodiment, there is provided a differential successive approximation analog to digital converter comprising: a comparator; a first plurality of capacitors coupled between a corresponding plurality of first switches and a first input of the comparator, at least one of the first capacitors being arranged to receive a first component of a differential input signal; and a second plurality of capacitors coupled between a corresponding plurality of second switches and a second input of the comparator, at least one of the second capacitors being arranged to receive a second component of the differential input signal, wherein each of the first and second plurality of switches are each adapted to independently couple the corresponding capacitor to a selected one of: a first supply voltage level; a second supply voltage level; and a third supply voltage level.

According to an embodiment, the converter comprises a register arranged to store outputs of the comparator, wherein each of the first and second switches is adapted to be controlled based on values stored in the register.

According to another embodiment, the first and second plurality of switches are also each adapted to independently coupled the corresponding capacitor to the first or second component of the differential input signal.

According to another embodiment, the register comprises a plurality of latches arranged to store outputs of the comparator.

According to another embodiment, each of the first and second switches comprises four transistors coupled between the corresponding capacitor and a respective one of the component of the differential input signal, the first voltage level, the second voltage level and the third supply level.

According to another embodiment, the converter further comprises control circuitry adapted to sample the differential input voltage during a sample phase, and to control the first and second switches to couple each capacitor of the first and second plurality of capacitors to the third voltage level at the start of a voltage conversion phase.

According to another embodiment, the first and second plurality of capacitors each comprises N capacitors 1 to N each having a corresponding capacitance equal to $$\frac{C}{2^i}$$

where the total capacitance of the first set of capacitors is equal to $$C - \frac{C}{2^N}$$

According to another embodiment, the converter further comprises a first additional capacitor coupled between the first input of the comparator and a third switch, and a second additional capacitor coupled between the second input of the comparator and a fourth switch wherein the first and second additional capacitors each have a capacitance equal to $$\frac{C}{2^N}$$

According to another embodiment, there is provided an analog to digital conversion unit comprising a plurality of the above converters arranged to sample the differential input signal in turn.

According to an embodiment, each of the analog to digital converters is an n-bit converter, and further comprising a first output register arranged to receive the n−1 most significant bits of the n-bit output value from each converter, and a second output register arranged to receive the least significant bit of the output register.

According to a further embodiment, there is provided an electronic device comprising the above analog to digital conversion unit.

According to a further embodiment, there is provided a method for performing analog to digital conversion by a differential successive approximation converter comprising: storing on a first plurality of capacitors a first component of a differential input signal; storing on a second plurality of capacitors a second component of the differential input signal; coupling each of the first plurality of capacitors between a third supply voltage level and a first input of a comparator; coupling each of the second plurality of capacitors between a third supply voltage level and a second input of the comparator; and based on an output of the comparator, coupling a capacitor of the first plurality of capacitors to a first voltage level and coupling a capacitor of the second plurality of capacitors to a second voltage level.

According to an embodiment, the third supply voltage level is a voltage level other than a mid-point between the first and second voltage levels.

According to another embodiment, the method further comprises, after coupling the capacitors of the first and second plurality to the first and second voltage levels respectively, determining a next output bit, and coupling another capacitor of each of the first and second plurality of capacitors to one of the first and second voltage levels.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which:

FIG. 1 illustrates an example of a SAR ADC;

FIG. 2 is a flow diagram showing an example of steps for performing analog to digital conversion based on the circuit of FIG. 1;

DETAILED DESCRIPTION

Figure 3:
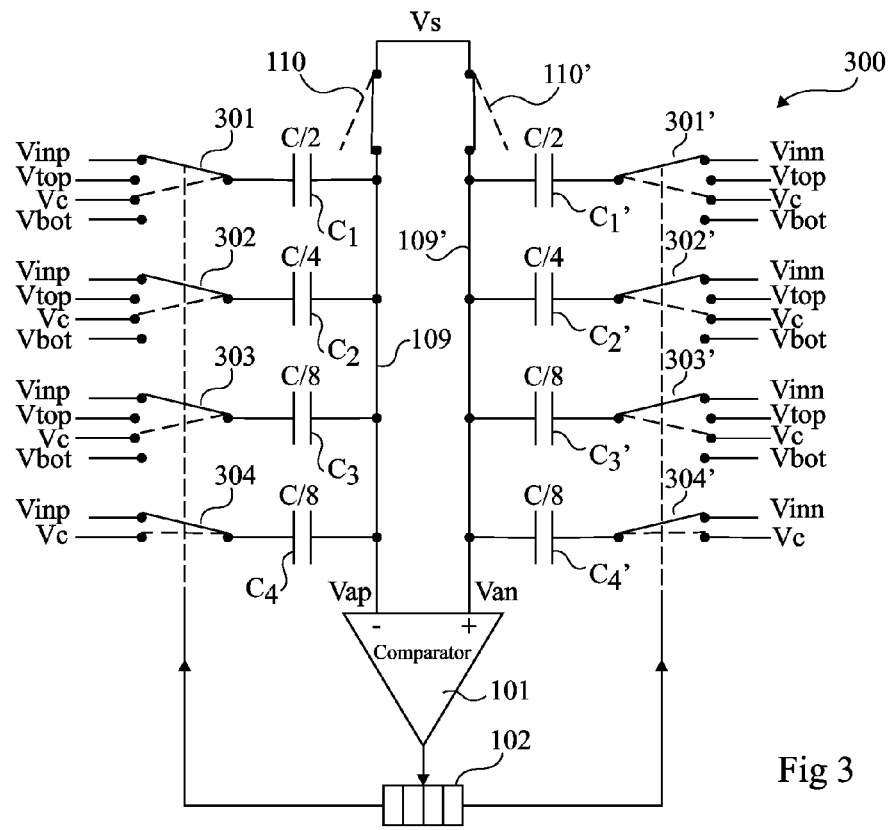
FIG. 3 illustrates a SAR ADC according to an embodiment.

FIG. 1 illustrates an example of a 4-bit SAR ADC 100. Converter 100 comprises a comparator 101, which provides an output to a 4-bit register 102 for storing a binary value resulting from the conversion.

Five switches 104 to 108 on a left-hand side of the converter, and five corresponding switches 104' to 108' on a right-hand side of the converter, are controlled based on the bits stored in register 102. The switches 104 to 108 are coupled to one terminal of respective capacitors C1 to C5, respectively having capacitances C/2, C/4, C/8, C/16 and C/16. Thus, the capacitance of each capacitor C1 to C4 is a different fraction of the total capacitance C of the capacitors C1 to C5. Similarly, the switches 104' to 108' are coupled to one terminal of respective capacitors C1' to C5', respectively having capacitances C/2, C/4, C/8, C/16 and C/16.

Each of the capacitors C1 to C5 has its other terminal connected to a node 109, which is, in turn, coupled to a negative input of the comparator 101. The voltage at node 109 is labelled Vap. Likewise, each of the capacitors C1' to C5' has its other terminal connected to a node 109', which is in turn coupled to the positive input terminal of comparator 101. The voltage at node 109' is labelled Van. Nodes 109 and 109' are further coupled to a supply voltage Vs via respective switches 110 and 110'.

Operation of the converter 100 of FIG. 1 will now be described with reference to the flow diagram of FIG. 2.

In a first step S0, a sample phase is performed, in which each of the switches 104 to 108 is coupled to a first component Vinp of the differential input signal and each of the switches 104' to 108' is coupled to a second component Vinn of the differential input signal. At the same time, the nodes 109 and 109' are connected, via switches 110 and 110' respectively, to the supply voltage Vs, which is for example at 0 V. This connection state of each of the switches is shown by the solid line of each switch. In this way the capacitors C1 to C5 and C1' to C5' are charged based on the differential input signal.

In a next step S1, nodes 109 and 109' are isolated from the supply voltage Vs by opening switches 110 and 110', and capacitors C1 and C2' to C5' are coupled to a high supply voltage Vtop via switches 104 and 105' to 108' respectively, while capacitors C1' and C2 to C5 are coupled to a supply voltage Vbot via switches 104' and 105 to 108 respectively. This connection state of each of the switches is shown by the dashed line in each switch. The voltages Vtop and Vbot are, for example, equal to 0.5 V and 0 V respectively, although other values could be used.

In a next step S2, the comparator determines whether Vap is greater than Van. In particular, with the configuration of the switches 104 to 108 and 104' to 108' as shown by the dashed lines in FIG. 1, on the left-hand side of the comparator, the capacitor C1 has half of the total capacitance C, and the capacitors C2 to C5 share the other half of the total capacitance C. Similarly for the right-hand side of the converter. It can be demonstrated that in step S2, Vap−Van=−(Vinp−Vinn).

Thus if Vap is less than Van, the output of the comparator is high, and the next step is S3, in which the most significant bit of the binary value is determined to be equal to "1", and the decision is made to keep C1 coupled to Vtop, and to keep C1' coupled to the Vbot.

On the other hand, if Vap is greater than Van, the output of comparison is low, and the next step is S4, in which the most significant bit will be determined to be "0". In this case, the coupling of capacitors C1 and C1' is modified, such that C1 is coupled to Vbot, and C1' is coupled to Vtop.

After steps S3 and S4, the next step is S5, in which the next bit of the output value is determined, by coupling C2 to Vtop and C2' to Vbot.

Next, in S6, again Vap is compared to Van, and then based on this comparison, steps similar to S3 and S4 are performed. For the sake of brevity, the subsequent steps are not illustrated in FIG. 2, but involve determining the value of the next bit, and deciding whether or not to keep C2 coupled to Vtop and C2' coupled to Vbot. This same process then continues for the next capacitors C3 and C3', and then for capacitors C4 and C4', which correspond to the least significant bit of the 4-bit output value. However, capacitors C5 and C5' remain coupled to Vbot and Vtop respectively.

Thus determining each bit value according to the method of FIG. 2 is two-step approach: a first step of switching a corresponding capacitor to be connected to Vtop or Vbot; and a second step of deciding whether to keep this connection or to change it.

A disadvantage of this two-step approach is that a relative large quantity of charge flows from the supply voltages. Furthermore, the charge flow is dependent on the particular decision that is taken. In particular, charge is shifted to/from the corresponding capacitors during the first phase, and may or may not need to be shifted from/to the corresponding capacitors again during the second phase, based on the decision. Furthermore, the residue charge remaining on the capacitors after each conversion is not constant, and thus there will be a variable voltage offset leading to noise in the output signal.

FIG. 3 illustrates an alternative embodiment of a 4-bit SAR ADC 300. Converter 300 comprises a comparator 101 and a 4-bit register 102 similar as to SAR ADC 100 of FIG. 1. A left-hand side of the converter 300 as illustrated comprises just four capacitors C1 to C4, having respective capacitance values C/2, C/4, C/8 and C/8. These capacitors are coupled on one side to switches 301 to 304 respectively. Similarly, a right-hand side of the converter 300 as illustrated comprises capacitors C1' to C4', also having values C/2, C/4, C/8 and C/8 respectively, and which are respectively coupled to switches 301' to 304'. As with the embodiment of FIG. 1, the other sides of capacitors C1 to C4 and C1' to C4' are coupled to nodes 109 and 109' respectively, which are in turn coupled to the negative and positive inputs respectively of comparator 101. Furthermore, nodes 109 and 109' are coupled to a supply voltage Vs via switches 110 and 110' respectively.

In the embodiment of FIG. 1, each of the switches 104 to 107 and 104' to 107' allows the corresponding capacitor to be coupled to one of three voltages: the input voltage Vinp or Vinn; the high supply voltage Vtop; or the low supply voltage Vbot. In the embodiment of FIG. 3, in addition to each of these three voltages, the switches 301 to 303 and 301' to 303' allow the corresponding capacitor to be connected to a supply voltage Vc. Furthermore, whereas switch 108 of FIG. 1 allows the final capacitor C5 to be coupled to input voltage Vinp or supply voltage Vbot, switch 304 of FIG. 3 allows the final capacitor C4 to be coupled to input voltage Vinp or supply voltage Vc Likewise, whereas switch 108' of FIG. 1 allows the final capacitor C5' to be coupled to input voltage Vinn or supply voltage Vtop, switch 304' of FIG. 3 allows the final capacitor C4 to be coupled to input voltage Vinn or supply voltage Vc.

The voltage Vc is a voltage level for example between Vtop and Vbot, and, for example, at the mid-point between these supply voltages, although other values are possible. For example, assuming Vtop is equal to 0.5 V and that Vbot is equal to 0 V, Vc could equal 0.25 V, or a different value, such as 0.4 V. Furthermore, because the same supply voltage Vc is provided to both sides of differential converter, this voltage may fluctuate without degrading the output signal.

The operation of the circuit 300 of FIG. 3 will now be described with reference to the flow diagram of FIG. 4. The 4 bits of the output of the comparator will be referred to as B3 to B0, where B3 is the most significant bit (MSB).

In a first step S0, a sample phase is performed, in which, in a similar fashion to the circuit 100 of FIG. 1, the nodes 109 and 109' are coupled to the supply voltage Vs via switches 110 and 110', and at the same time each of the switches 301 to 304 is coupled to the input voltage Vinp, and each of the switches 301' to 304' is coupled to the input voltage Vinn. This connection state is shown by a solid line in each switch of FIG. 3.

Next, in step S1, the comparator inputs are isolated from supply voltage Vs by opening switches 110 and 110', and the capacitors C1 to C4 and C1' to C4' are all coupled to supply voltage Vc. This configuration is shown by a dashed line in each switch of FIG. 3.

In a next step S2, the comparator determines whether Vap is greater than Van, which is the same as determining whether Vinp is greater than Vinn. In particular, initially Vap=Vs+(Vc−Vinp), while Van=Vs−(Vinn−Vc), and thus Vap Van=(Vinp−Vinn), and so the comparison is between Vinp and Vinn.

If it is determined in S2 that Vinp is greater than Vinn, then the next step is S3, in which the MSB B3 of the 4-bit output is set to "1", and switches 301 and 301' are switched such that capacitor C1 is coupled to Vtop, and capacitor C1' is coupled to Vbot.

Alternatively, if it is determined in S2 that Vinp is less than Vinn, then the next step is S4, in which the MSB B3 of the 4-bit output is set to "0", and switches 301 and 301' are switched such that capacitor C1 is coupled to Vbot, and capacitor C1' is coupled to Vtop.

After steps S3 and S4, the next step is S5, in which again Vap and Van are compared by the comparator. Now however capacitors C1 and C1' have been coupled to one of the supply voltages Vtop and Vbot. If C1 was coupled to Vtop and C1' was coupled to Vbot in step S3, due to the binary weighting of capacitor C1 in the capacitor array, Vap becomes equal to Vs+(Vc−Vinp)+(Vtop−Vc)/2, while Van becomes equal to Vs+(Vc−Vinn)−(Vc−Vbot)/2. Thus Vap−Van is equal to −(Vinp−Vinn)+(Vtop−Vbot)/2. Alternatively, if C1 was coupled to Vbot and C1' to Vtop in step S4, Vap−Van is equal to −(Vinp−Vinn)−(Vtop−Vbot)/2.

If it is determined in S5 that Vap is less than Van, the next step is S6, in which B2 is set equal to "1", capacitor C2 is coupled to Vtop, and capacitor C2' is coupled to Vbot.

Alternatively, if it is determined in S5 that Vap is greater than Van, the next step is S7, in which B2 is set equal to "0", capacitor C2 is coupled to Vbot, and capacitor C2' is coupled to Vtop.

After steps S6 and S7, the method continues by comparing again Vap and Van based on the new connections of the capacitors C2 and C2', but this step and subsequent switching steps of C1 and C1' are not illustrated for the sake of brevity. Instead, the method goes straight to a step S8, once each of the switches 301 to 303 and 301' to 303' has been connected to either Vtop or Vbot.

In step S8, the least significant bit B0 of the output value is determined, based on a comparison of Vap and Van.

If in S8 it is determined that Vap is less than Van, the next step is S9, in which B0 is set to "1".

Alternatively, if in S8 it is determined that Vap is greater than Van, the next step is S10, in which B0 is set to "0".

It will be noted that in this final step, because the decision concerning B0 can be taken before switching a corresponding capacitor, the switching of this capacitor doesn't need to take place, and thus there is no equivalent of capacitors C4 and C'4 of FIG. 1, nor switches 107 and 107' in converter 300. Thus a pair of capacitors and switches may be removed.

Capacitors C4 and C4', which remain coupled to Vc throughout the voltage detection process, can be omitted in alternative embodiments. The purpose of these capacitors is to bring the total capacitance to C, which results in a unity gain converter. Otherwise, gain is equal to 1½N, where N is the number of bits.

Figure 4:
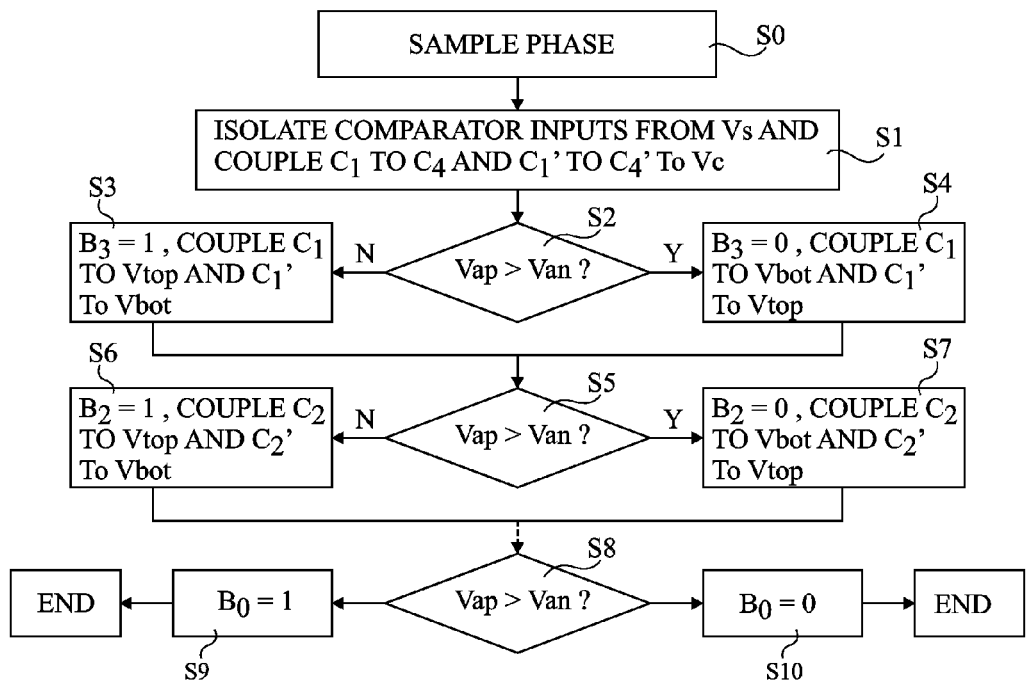
FIG. 4 is a flow diagram illustrating steps in a method for performing analog to digital conversion based on the circuitry of FIG. 3 according to embodiments.

Thus in the conversion process of FIG. 4, the bit decisions are made using one step rather than two steps, by a single switching operation after each comparison. Thus, the current drawn from the supplies is the same for each of the corresponding decisions of each bit.

While the embodiment of FIG. 3 is a 4-bit converter, it will be apparent to those skilled that an N-bit converter, with N, for example, a value in the range 2 to 32, could be implemented using fewer or more capacitors.

Figure 5:
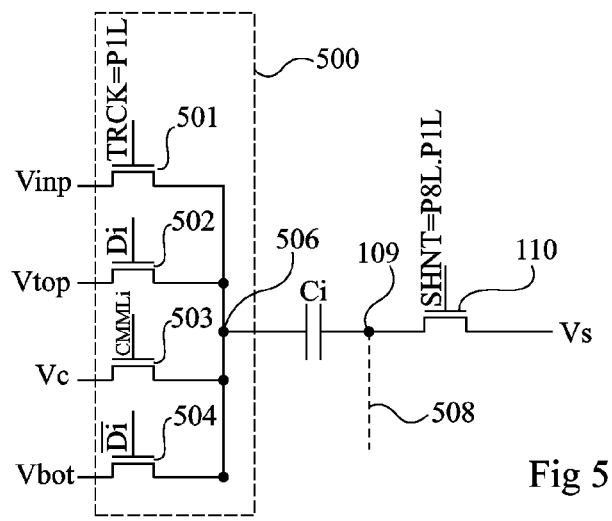
FIG. 5 illustrates a switch of the circuit of FIG. 3 in more detail according to embodiments.

FIG. 5 illustrates an example of the implementation of a switch 500, which represents any of the switches 301 to 304 of FIG. 3, and the same implementation could be used for any of the switches 301' to 304', but with the Vinp input replaced by the Vinn input.

Switch 500 receives, at four corresponding input terminals, the voltages Vinp, Vtop, Vc and Vbot, and allows one of these voltages to be selectively coupled to the capacitor Ci, which is, for example, any of the capacitors C1 to C3. Switches 304 and 304' can be implemented by similar circuitry, but without the Vtop and Vbot inputs.

The switch 500 comprises four transistors 501 to 504 each coupled by their main current terminals between a terminal 506 of capacitor Ci and a respective one of the input lines for receiving the voltage Vinp, Vtop, Vc or Vbot. Each of the transistors 501 to 504 is for example a MOS transistor, although other types of transistors could be used. Transistor 501 is controlled by a control signal "TRCK" at its gate node to couple the input voltage Vinp to terminal 506. In this example, control signal "TRCK" is equal to a timing signal P1L, described in more detail below. The transistor 502 is controlled by a control signal Di at its gate node to couple the supply voltage Vtop to terminal 506, while transistor 504 is controlled by a control signal $\overline{Di}$ at its gate node to couple the supply voltage Vbot to node 506, which is the inverse of signal Di, except during reset. Transistor 503 is controlled by a control signal CMMLi at its gate node to couple the supply voltage Vc to terminal 506.

FIG. 5 also shows the connection of capacitor Ci to node 109, which, as represented by a dashed line 508, is in turn coupled to the other capacitors. Furthermore, the switch 110 coupling node 109 to supply voltage Vs is illustrated, comprising a transistor, which is, for example, also a MOS transistor, and is controlled at its gate node by a control signal "SHNT", in this example equal to the logic AND operation between two timing signals P8L and P1L described in more detail below.

Figure 6:
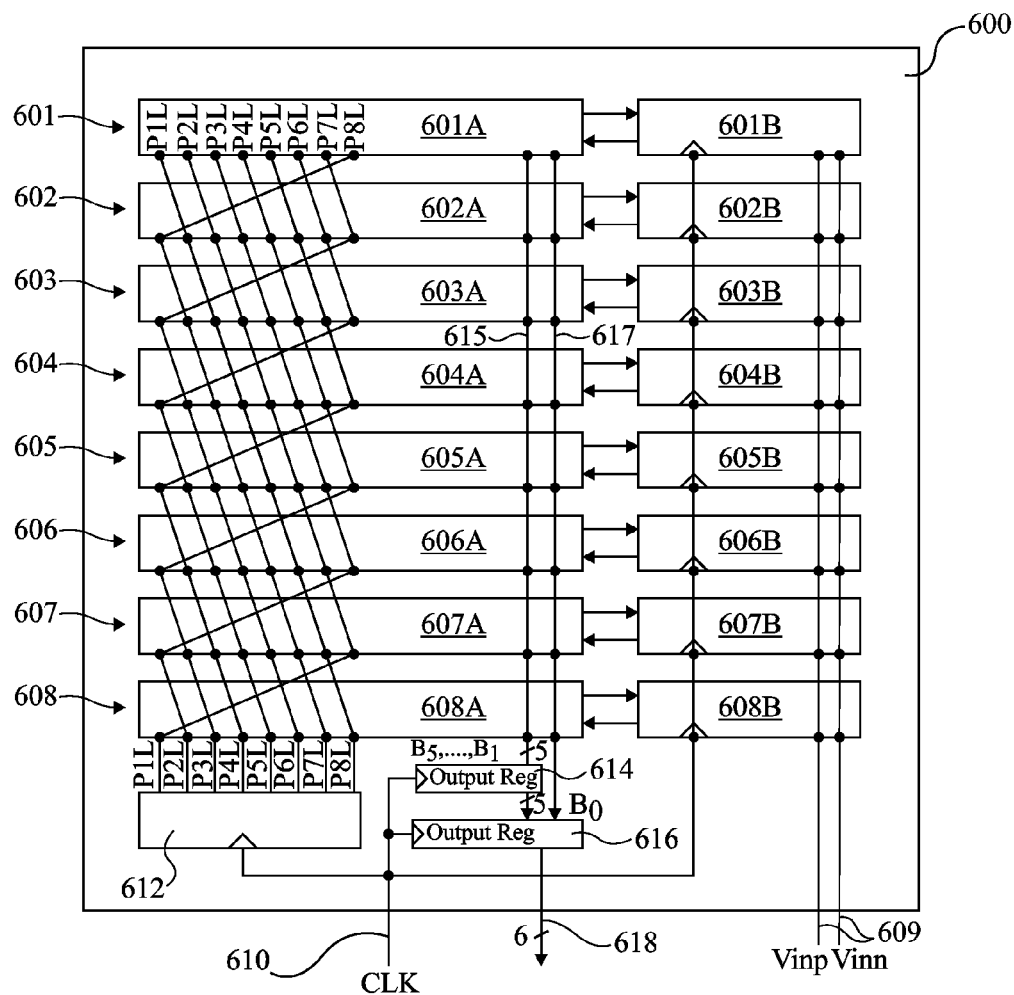
FIG. 6 illustrates an analog to digital conversion unit according to embodiments.

FIG. 6 illustrates an embodiment of an analog to digital conversion unit 600, which comprises in this example eight SAR ADCs 601 to 608 operating in a cyclic manner. Each of the converters 601 to 608 is for example similar to converter 300 of FIG. 3, but in this example is a 6-bit converter, and thus comprises capacitors C1 to C5 having capacitances C/2, C/4, C/8, C/16 and C/32 respectively, and capacitors C1' to C5' also having capacitances C/2, C/4, C/8, C/16 and C/32 respectively. It may optionally comprise sixth capacitors C6 and C6' each having a capacitance value of C/32, and performing similar roles to capacitors C4 and C4' of FIG. 3. There is a phase shift between the operations of each converter 601 to 608, such that the differential input signal is sampled at eight times the effective supply frequency of each converter. In this example, each converter 601 to 608 comprises a digital portion 601A to 608A respectively, and an analog portion 601B to 608B respectively.

The digital portions 601A to 608A each comprise the switching control logic, in particular the circuitry for controlling switches 500 and the switches 110 and 110' of FIG. 5. The analog portions 601B to 608B each comprise the switches 500 and 110, the capacitors C1 to C5, and the comparator 101. Thus the connections, represented in FIG. 6 by an arrow from each digital portion 601A to 608A to the corresponding analog portion 601B to 608B provide the control signals TRCK, Di and its inverse, CMMLi and SHNT, while further connections, represented in FIG. 6 by an arrow from each analog portion 601B to 608B to the corresponding digital portion 601A to 608A, provide the output of the comparator.

An input 609 comprises a pair of lines for receiving the differential input signal Vinp, Vinn, which is then sampled by each of the analog portions 601B to 608B. The supply voltages Vtop, Vbot and Vc (not illustrated) are also provided to each analog portion 601B to 608B.

A clock signal CLK is received on an input line 610 to the conversion unit 600, having, for example, a frequency of 1 GHz, although other frequencies are possible. The clock signal is provided to a timing distribution block 612, which generates 8 timing signals P1L to P8L based on the clock signal CLK. These signals are all provided to each of the eight digital portions 601A to 608B, but in a different order, as will be explained in more detail below. The clock signal CLK is also coupled to each of the analog portions 601B to 608B, for controlling the decision timing of the comparator.

An output register 614, for example, comprises five flip-flops, and receives output bits B1 to B5, from each of the digital portions 601A to 601B in turn on a line 615. A further output register 616, for example, comprises 6 flip-flops, which receive the least significant bit B0 from each of the digital portions 601A to 601B on a line 617, and the five bits from output register 614. The output register 616 outputs a 6-bit output signal on an output line 618.

Operation of the conversion unit 600 of FIG. 6 will now be described with reference to the timing diagrams of FIG. 7.

A first signal 701 is the clock signal CLK, as received on the input line 610, comprising of a square wave, for example, with a frequency of 1 GHz.

A group of signals 702 is then shown, representing the timing signals P1L to P8L generated by the generation block 612 and provided to each of the digital portions 601A to 608A. As illustrated, the first timing signal P1L comprises one positive pulse of the clock signal CLK once every 8 periods of the clock signal CLK. The other timing signals PjL, for j equal to 2 to 8, are the same as the first timing signal P1L, but with their positive pulses delayed by j-1 clock periods of the clock signal CLK. Thus the positive pulse of timing signal P8L occurs seven clock periods after the pulse of signal P1L, which is one clock period before the next positive pulse of the timing signal P1L.

A next signal 703 is the control signal TRCK, which controls when the input voltage is coupled to each of the capacitors, and is identical to the first timing signal P1L.

A next signal 704 is the signal "SHNT" that controls when the nodes 109 and 109' are coupled to the supply voltage Vs, and is equal to a logic AND between timing signals P1L and P8L. During the high pulse of P1L, the input signal is sampled to the capacitors, and thus nodes 109 and 109' are coupled to Vs. The voltages at nodes 109 and 109' are reset for example for offset calibration purposes, although offset calibration is optional. During offset calibration, the switches are all coupled to supply voltage Vc, the inputs of the comparator 101 are grounded, and the output of the comparator is measured.

The next group of signals 705 shows the control signal CMMLi for controlling when the supply voltage Vc is coupled to each capacitor C1 to C5, and also, with dashed lines, the control signals Di and $\overline{\text{Di}}$ for controlling when supply voltages Vtop and Vbot are coupled to each capacitor.

Between the rising edges of the timing signals P2L and P3L, all the signals CMML1 to CMML5 are high. At the rising edge of timing signal P3L, the signal CMML1 goes low, and either D1 or $\overline{\text{D1}}$ goes high until the next rising edge of timing signal P8L, depending on the decision of the comparator just before CMML1 goes low. The value of D1 corresponds to the MSB of the output value, which in this example is bit B5. Next, at the rising edge of the timing signal P4L, the signal CMML2 goes low, and either D2 or $\overline{\text{D2}}$ goes high until the next rising edge of the timing signal P8L, depending on the decision of the comparator just before CMML2. The value of D2 corresponds to bit B4 of the output value. This process continues, until the rising edge of timing signal P7L, when the final control signal D5 or $\overline{\text{D5}}$ goes high, and all the signals CMML1 to 5 are low. Then, at the rising edge of timing signal P8L, all the signals D1 to D5 go low, and the signals CMML1 to CMML5 go high, coupling the capacitors to the supply voltage Vc while they are reset.

The next signal 706 shows, by a dashed line, the bit value of B0 being output, based on the decision of the comparator during the switch configuration present between the rising edge of P7L and the rising edge of P8L. As explained above, no capacitor is switched based on this final bit value.

The next signal 707 shows the assertion of a write signal in respect of the bits B5 to B1, which occurs between the rising edges of timing signals P7L and P8L. In particular, the values B5 to B1 are written to output register 614 of FIG. 6.

The next signal 708 shows the assertion of a write signal in respect of bit B0, which occurs between the rising edge timing signal P8L and the rising edge of the next pulse of timing signal P1L.

Figure 7:
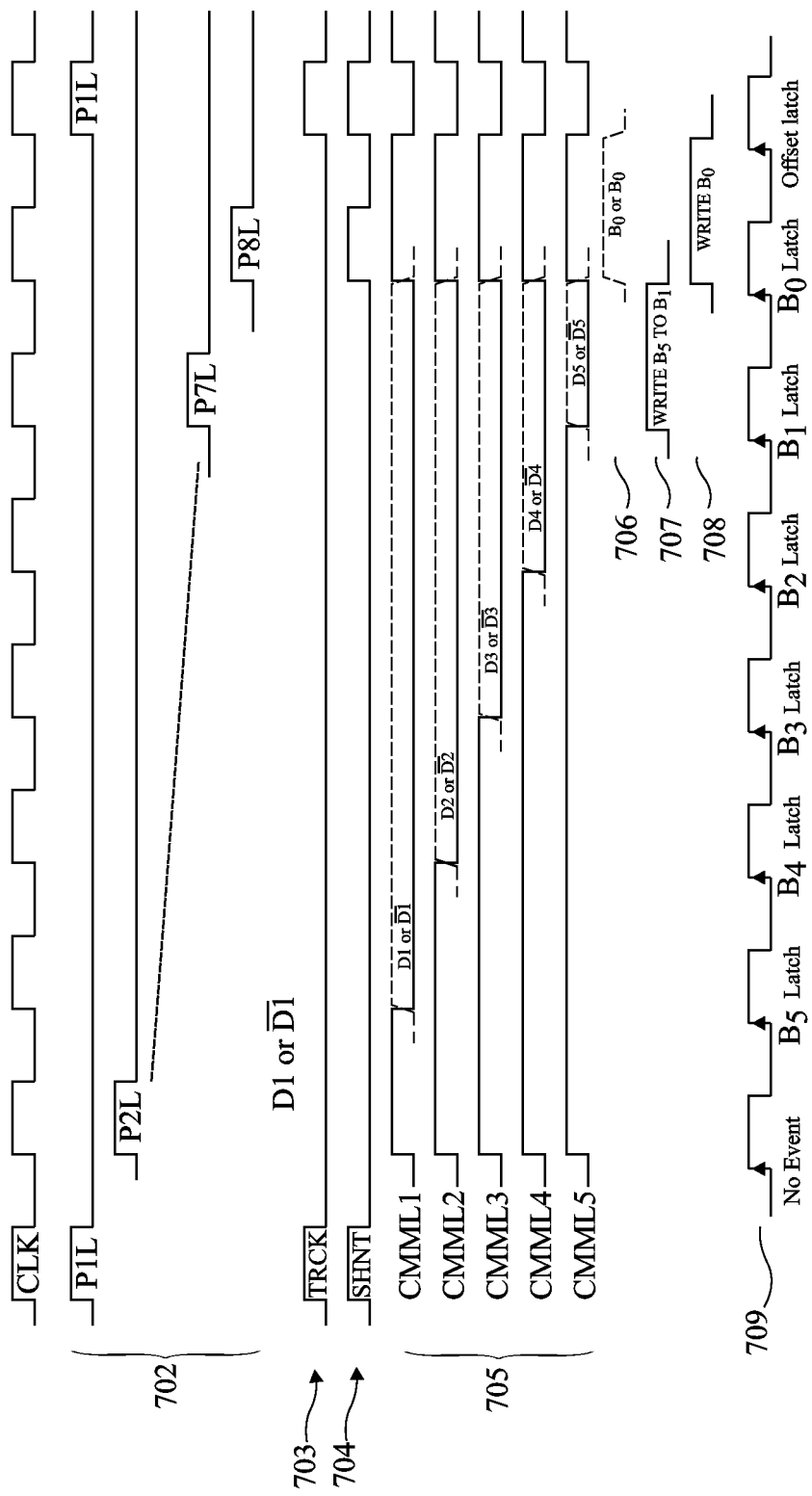
FIG. 7 is a timing diagram showing the timing of signals in the analog to digital conversion unit of FIG. 6 according to an embodiment.

The last signal 709 of FIG. 7 shows the clock signal of the comparator for timing decisions, which controls when the output of the comparator is stored as Di and $\overline{\text{Di}}$ values in a corresponding latch in the digital portions 601A to 608A, prior to being output as a bit value to the output register 614 or 616. As illustrated, the decision corresponding to bit B5 occurs just before the rising edge of timing pulse P3L, the decision corresponding to bit B4 occurs just before the rising edge of timing pulse P4L, the decision corresponding to bit B3 occurs just before the rising edge of timing pulse P5L, the decision corresponding to bit B2 occurs just before the rising edge of timing pulse P6L, the decision corresponding to bit B1 occurs just before the rising edge of timing pulse P7L, and finally the decision corresponding to bit B0 occurs just before the rising edge of timing pulse P8L. Then, during the next high pulses of timing signal P1L, an offset pulse is asserted for offset calibration.

While each of the converters 601 to 608 of the conversion unit 600 of FIG. 6 respects the same timing as shown in FIG. 7, the timing signals P1L to P8L received by each of the converters will be different, resulting in an out of phase, cyclic operation. In particular, as illustrated in FIG. 6, the signal forming P7L for converter 601 forms signal P8L for converter 602, and forms signal P1L for converter 603 etc. . . . and finally forms signal P6L for converter 608. Likewise for the other timing signals.

Figure 8A:
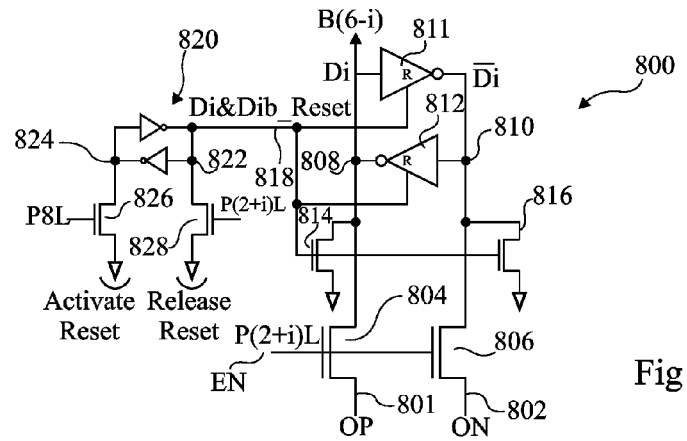
FIGS. 8A, 8B, 9A, 10 and 11 illustrate circuitry for generating control signals for controlling transistors of the switch of FIG. 5 according to embodiments.

FIG. 8A illustrates a latch circuit 800 for storing a decision Di and $\overline{\text{Di}}$ based on a signal OP equal to the output of comparator 101 received on an input line 801, and a signal ON, equal, except during reset, to the inverse of signal OP, and received on an input line 802. The values Di and $\overline{\text{Di}}$ are then used for the control of corresponding switches, in the same way as shown in FIG. 5.

The circuit comprises transistors 804 and 806 receiving the signals OP and ON respectively on one of their main current terminals, the other of their main current terminals being coupled to storage nodes 808, 810 respectively of a latch. The state of the voltages at nodes 808 and 810 are maintained by a pair of inverters 811, 812, coupled head to tail between the nodes 808 and 810. A similar circuit 800 is provided for each value Di, with i in this example equal from 5 to 1, and an enable signal provided to a gate node of the transistors 804, 806 corresponds to the timing signal P(2+i)L. Thus, when the signal P(2+i)L is high for a given latch, the latch stores the corresponding output of the comparator to the nodes 808 and 810.

Transistors 814 and 816 are coupled between ground and the nodes 808, 810 respectively, allowing the voltage at these nodes to be reset by a reset signal Di&Dib_Reset, provided on a line 818 to the gate nodes of transistors 814 and 816. This reset signal is also provided to a reset input R of the inverters 811, 812. This reset signal is provided by reset signal generation circuitry 820 comprising nodes 822 and 824 storing complementary voltages maintained by a pair of inverters coupled head to tail. The values at nodes 822 and 824 are programmed to activate the reset by coupling node 824 to ground via a transistor 826, which is activated by the signal P8L. The reset is released by coupling node 822 to ground via a transistor 828 controlled at its gate node by the timing signal P(2+i)L. As illustrated, the value Di stored at node 808 then provides the output bit B(6−i).

A latch for storing and outputting bit B0 is implemented in the same way as latch circuit 800, except that transistor 826 will be activated by the timing signal P1L.

Figure 8B:
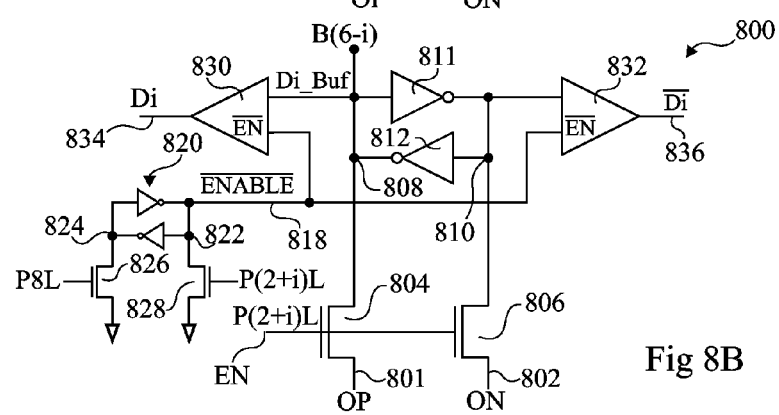

FIG. 8B illustrates the latch circuit 800 of FIG. 8A according to an alternative embodiment, and in FIG. 8B features in common with those of FIG. 8A have been labeled with like reference numerals and will not be described again in detail.

In FIG. 8B, the transistors 814 and 816 have been removed, as well as the reset inputs of inverters 811 and 812. Instead, buffers 830 and 832 are provided, respectively coupled between the nodes 808, 810 and respective output lines 834, 836. Lines 834, 836 provide the data signals Di and $\overline{\text{Di}}$ respectively when the buffers 830, 832 are enabled. Each of the buffers 830, 832 comprises an enable input coupled to line 818, and is enabled by a low signal. The signal on line 818 is thus labeled in FIG. 8B as an inverse enable signal $\overline{\text{ENABLE}}$.

Operation of the latch circuit of FIG. 8B is very similar to that of FIG. 8A, and has the advantage that the data signal Di_Buf stored at node 808 is isolated from the output lines 834 and 836 by the buffers 830, 832. Thus the data signal Di_Buf can be kept at node 808 irrespective of whether output signals Di and $\overline{\text{Di}}$ are enabled, and thus the corresponding data bit B(6−i) can be provided on an output bus after the pulse P8L has disabled the output of buffers 830, 832. Furthermore, the output bit B(6−i) from each latch 800, including the bit B0, can be provided on the output bus at a same time.

Figure 9A:
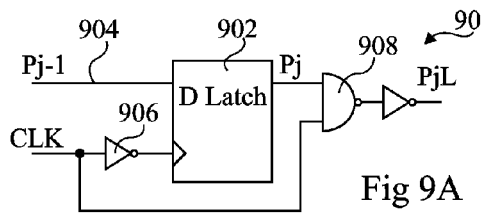

FIG. 9A illustrates an example of a circuit 900 present in the timing signal generation block 612 of FIG. 6, which is repeated 8 times for generating the signals PjL, for j equal to 1 to 8, based on the signal Pj−1. The circuit 900 comprises a D-type latch 902, which receives at a data input the signal Pj−1 on an input line 904, and on a clock input the clock signal CLK after inversion by an inverter 906. The output Pj of the latch and the clock signal CLK provide the inputs to a 2-input NAND gate 908. The output of NAND gate 908 is inverted by an inverter 910 to provide the signal PjL.

Figure 9B:
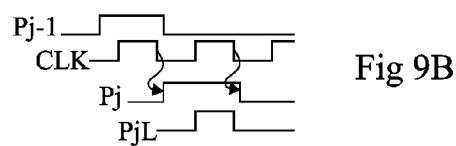
FIG. 9B shows timing diagrams corresponding to the circuitry of FIG. 9A according to an embodiment.

FIG. 9B shows the timing of the signals Pj−1, CLK, Pj and PjL. As illustrated, the signal Pj−1 is sampled on the falling edge of CLK, and when this clock signal goes low, the signal Pj goes high for one period of clock CLK. This in turn causes the output of the NAND gate 908 to go low for the duration of the high clock pulse, and thus the signal PjL has a pulse width equal to the pulse width of the clock signal CLK.

Figure 10:
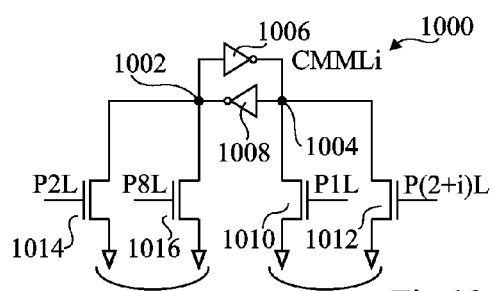

FIG. 10 illustrates circuitry 1000 for generating the signals CMMLi of FIG. 7, which control when the signal Vc is coupled to the capacitor Ci. As shown, nodes 1002 and 1004 store complementary voltages maintained by inverters 1006 and 1008 coupled head to tail. The signal at node 1004 provides the signal CMMLi. Transistors 1010 and 1012 are coupled between node 1004 and ground, and bring the signal CMMLi low when the timing signal P1L at the gate of transistor 1010 is high, or when the timing signal P(2+$i$)L at the gate of transistor 1012 is high. Transistors 1014 and 1016 are coupled between node 1002 and ground, and bring the voltage at node 1004 high when P2L or P8L is low. In particular, transistors 1014 and 1016 respectively receive at their gate nodes the timing signals P2L and P8L.

Figure 11:
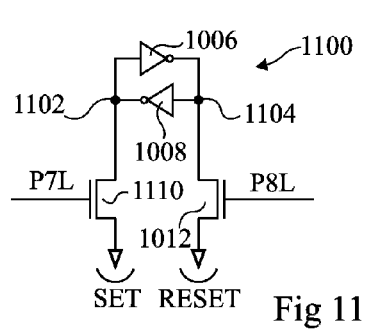

FIG. 11 illustrates an example of a circuit 1100 for generating the write signal 707 of FIG. 7. Nodes 1102 and 1104 store complementary voltages maintained by inverters 1106 and 1108 coupled head to tail. The voltage at node 1104 provides the write signal, which is brought high at the start of the timing pulse P7L, and is brought low again at the start of the timing pulse P8L. For this, a transistor 1110 is coupled between node 1102 and ground, and receives at its gate node the signal P7L, and a transistor 1112 is coupled between node 1104 and ground, and receives the signal P8L at its gate node.

Figure 12:
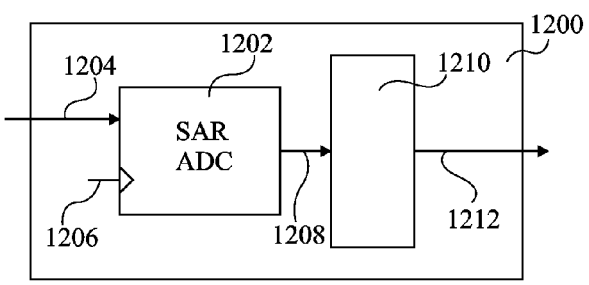
FIG. 12 illustrates an electronic device comprising the analog to digital conversion unit of FIG. 6 according to embodiments.

FIG. 12 illustrates an electronic device 1200 comprising a SAR ADC 1202, which for example corresponds to the analog to digital conversion unit 600 of FIG. 6. The SAR ADC 1202 receives an input signal on an input line 1204, this signal for example being a differential input signal. It also receives a clock signal on an input line 1206. Unit 1202 converts the analog signal, after sampling, into a 6-bit digital value, although a different number of bits may be generated. The output binary signal is provided on an output line 1208, which is provided to a block 1210, which is, for example, a processor and/or a memory device. An output signal is generated from block 1210 on an output line 1212.

The device 1200 is, for example, a mobile communications device, PDA (Personal Digital Assistant), digital media player, lap top computer or other digital electronic devices.

An advantage of the embodiments described herein is that, by providing a voltage level Vc in addition to the voltage levels Vtop and Vbot selectable by the switches of the capacitor arrays, this voltage may be used as a neutral start point for each decision, such that the decision as to whether to couple each capacitor to the voltage level Vtop or Vbot can be made for each side of the differential converter prior to changing the connection. Due to the differential arrangement of the device, this advantageously leads to a lower quantity of charge being drawn from the voltage levels Vtop and Vbot, as during reset, the charge supplied to the capacitors will be substantially the same.

A further advantage of these embodiments is that, due to the differential nature of the converter, Vc is present on both inputs of the comparator, and thus cancels. This means that Vc is not limited to being at a value exactly halfway between the voltage levels Vtop and Vbot, although performance is improved when Vc is approximately at the mid-point. Furthermore, Vc need not be constant, but may fluctuate.

Furthermore, because the decision regarding whether to connect each capacitor to voltage Vtop or Vbot is made prior to switching that capacitor, a final capacitor corresponding to the least significant bit of the output digital value can be omitted, leading to one less pair of capacitors in the converter.

Furthermore, the smallest capacitor can be larger compared to the smallest capacitor in the embodiment of FIG. 1, and/or the total capacitance can be reduced.

Having thus described at least one illustrative embodiment of the invention, various alterations, modifications and improvements will readily occur to those skilled in the art.

For example, while the embodiments have been described in relation to a 4 or 6-bit converter, the same principles can equally be applied to any n-bit converter, where n is between 2 and 32.

Furthermore, while in the described embodiments the capacitors of the capacitor arrays have a binary weighting, alternatively they could have different weightings, for example if a non-linear quantization is to be applied.

Furthermore, while in the embodiment of FIG. 3 the differential input voltage has been represented as being applied by switches 301 to 304 and 301' to 304', it will be apparent to those skilled in the art that alternatively the supply voltage Vs could be applied via these switches, and the differential input voltage could be applied via switches 110 and 110', for example with their sign reversed.

Furthermore, while the transistors throughout the figures are shown to be MOS transistors, it will be apparent to those skilled in the art that other types of transistors could be used.

The variations features described in relation to the various embodiments could be combined in alternative embodiments in any combination.

Such alterations, modifications and improvements are intended to be within the spirit and scope of the invention. Accordingly, the foregoing description is by way of example only and is not intended to be limiting. The invention is limited only as defined in the following claims and the equivalent thereto.

What is claimed is:

1. A differential successive approximation analog to digital converter comprising:
   a comparator;
   a first plurality of capacitors coupled between a corresponding first plurality of switches and a first input of said comparator, at least one of said first capacitors being arranged to receive a first component of a differential input signal; and
   a second plurality of capacitors coupled between a corresponding second plurality of switches and a second input of said comparator, at least one of said second capacitors being arranged to receive a second component (Vinn) of said differential input signal, wherein said first and second plurality of switches are adapted to independently couple the corresponding capacitors to a selected one of:
   a first supply voltage level;
   a second supply voltage level; and
   a third supply voltage level; and
   control circuitry adapted to sample said differential input voltage during a sample phase, and to control said first and second plurality of switches to couple each capacitor of the first and second plurality of capacitors to said third supply voltage level at the start of a voltage conversion phase.

2. The converter of claim 1, wherein said third supply voltage level is between said first and second supply voltage levels.

3. The converter of claim 1, comprising a register arranged to store outputs of said comparator, wherein each of said first and second plurality of switches is adapted to be controlled based on values stored in said register.

4. The converter of claim 1, wherein said first and second plurality of switches are also each adapted to independently couple the corresponding capacitor to said first or second component of the differential input signal.

5. The converter of claim 1, wherein said register comprises a plurality of latches arranged to store outputs of said comparator.

6. The converter of claim 1, wherein each of said first and second plurality of switches comprises four transistors coupled between the corresponding capacitor and:
- a respective one of the components of the differential input signal;
- the first voltage supply level;
- the second voltage supply level; and
- the third voltage supply level.

7. The converter of claim 1, wherein said first and second plurality of capacitors each comprises N binary-weighted capacitors each having a corresponding capacitance equal to $$\frac{C}{2^i}$$

where i is an integer having a value $1 \leq i \leq N$.

8. The converter of claim 7, further comprising a first additional capacitor coupled between said first input of said comparator and a third switch, and a second additional capacitor coupled between said second input of said comparator and a fourth switch wherein said first and second additional capacitors each have a capacitance equal to $$\frac{C}{2^N}.$$

9. An analog to digital conversion unit comprising a plurality of the converters of claim 1 arranged to sample said differential input signal in turn.

10. The analog to digital conversion unit of claim 9, wherein each of said analog to digital converters is an n-bit converter, and further comprising a first output register arranged to receive the n−1 most significant bits of the n-bit output value from each converter, and a second output register arranged to receive the least significant bit from each converter.

11. An electronic device comprising the analog to digital conversion unit of claim 9.

12. A method for performing analog to digital conversion by a differential successive approximation converter comprising:
- storing on a first plurality of capacitors a first component of a differential input signal;
- storing on a second plurality of capacitors a second component of said differential input signal;
- coupling each of said first plurality of capacitors between a mid-value supply voltage level and a first input of a comparator;
- coupling each of said second plurality of capacitors between said mid-value supply voltage level and a second input of said comparator; and
- based on a first output of said comparator, coupling a first capacitor of said first plurality of capacitors to a first voltage level and coupling a first capacitor of said second plurality of capacitors to a second voltage level.

13. The method of claim 12, wherein said mid-value supply voltage level is a voltage level other than a mid-point between said first and second voltage levels.

14. The method of claim 12, further comprising, after coupling said first capacitors of the first and second plurality to the first and second voltage levels respectively, receiving a second output from the comparator for a next output bit, and coupling second capacitors of each of said first and second plurality of capacitors to one of said first and second voltage levels based upon the received second output.

15. The method of claim 14, further comprising providing first and second output bits to at least one output register, wherein the first and second output bits are representative of the couplings of the respective first and second capacitors to the first and second voltage levels.

16. The method of claim 15, wherein the first output bit is provided to a first output register and the second output bit is provided to a second output register that is configured to receive bit values from the first output register.

17. The method of claim 14, further comprising:
- receiving, at a first converter unit of the converter, a time-staggered sequence of pulses;
- sampling, at the first converter unit, the first component and the second component of the differential input signal on a first pulse; and, after coupling the first capacitors of the first and second plurality to the first and second voltage levels respectively,
- coupling, on an immediately subsequent pulse of the sequence of pulses, the second capacitors of each of said first and second plurality of capacitors to one of said first and second voltage levels based upon the received second output.

18. The method of claim 12, further comprising:
- decoupling each of the first plurality of capacitors from the first component of the differential input signal prior to coupling each of the first plurality of capacitors between the mid-value supply voltage level and the first input of the comparator; and
- decoupling each of the second plurality of capacitors from the second component of the differential input signal prior to coupling each of the second plurality or capacitors between the mid-value supply voltage level and the second input of the comparator.

19. The method of claim 12, further comprising:
- coupling all switches to a first calibration voltage level;
- coupling the inputs of the comparator to a second calibration voltage level; and
- measuring the output of the comparator.

20. The method of claim 19, wherein the first calibration voltage level is the mid-value supply voltage level and the second calibration voltage level is a ground voltage level.

21. A successive approximation analog to digital converter comprising:
- a first plurality of capacitors having corresponding first nodes and second nodes, wherein the second nodes are coupled to an input of a comparator; and
- a first plurality of switches, wherein each switch is configured to switch the first node of a corresponding capacitor of the first plurality of capacitors between one of the following voltage levels: an input voltage, a first voltage, a mid-value voltage, and a second voltage.

22. The converter of claim 21, wherein the mid-value voltage is a voltage level between the first voltage level and the second voltage level.

23. The converter of claim 21, wherein the capacitors are binary weighted.

24. The converter of claim 21, further comprising:
a first additional capacitor; and
a first additional switch configured to switch a first node of the first additional capacitor between the input voltage or the mid-value voltage.

25. The converter of claim 21, further comprising a first additional switch configured to couple the second nodes of the first plurality of capacitors to a reference voltage.

26. The converter of claim 21, further comprising an output n-bit register configured to store a binary value based upon output values of the comparator.

27. The converter of claim 26, wherein the n-bit register is configured to control the settings of the first plurality of switches based upon the bits stored in the n-bit register.

* * * * *

UNITED STATES PATENT AND TRADEMARK OFFICE
CERTIFICATE OF CORRECTION

PATENT NO. : 8,497,795 B2
APPLICATION NO. : 13/166117
DATED : July 30, 2013
INVENTOR(S) : Stéphane Le Tual et al.

It is certified that error appears in the above-identified patent and that said Letters Patent is hereby corrected as shown below:

In the Specification

Col. 9, Line 44, should read:
B3 occurs just before the rising edge of timing pulse P5L, the Signed and Sealed this
Seventeenth Day of September, 2013

Teresa Stanek Rea
*Deputy Director of the United States Patent and TrademarkOffice*